(12) United States Patent
Kawamura

(10) Patent No.: US 12,279,363 B2
(45) Date of Patent: Apr. 15, 2025

(54) ELECTROMAGNETIC WAVE ABSORBER

(71) Applicant: SONY GROUP CORPORATION, Tokyo (JP)

(72) Inventor: Takashi Kawamura, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 96 days.

(21) Appl. No.: 18/248,586

(22) PCT Filed: Sep. 14, 2021

(86) PCT No.: PCT/JP2021/033617
§ 371 (c)(1),
(2) Date: Apr. 11, 2023

(87) PCT Pub. No.: WO2022/085337
PCT Pub. Date: Apr. 28, 2022

(65) Prior Publication Data
US 2023/0397324 A1    Dec. 7, 2023

(30) Foreign Application Priority Data
Oct. 20, 2020 (JP) .................... 2020-176081

(51) Int. Cl.
*H05K 1/02* (2006.01)
*H05K 1/16* (2006.01)

(52) U.S. Cl.
CPC ........... *H05K 1/0218* (2013.01); *H05K 1/162* (2013.01); *H05K 2201/09263* (2013.01)

(58) Field of Classification Search
CPC ................. H05K 1/0218; H05K 1/162; H05K 2201/09263
(Continued)

(56) References Cited

U.S. PATENT DOCUMENTS

2005/0184372 A1* 8/2005 Asahi ............... H05K 1/148
257/678
2016/0164461 A1* 6/2016 Ozawa ............... H05K 1/181
331/116 R

FOREIGN PATENT DOCUMENTS

CN    102781206 A    11/2012
CN    103259097 A    8/2013
(Continued)

OTHER PUBLICATIONS

International Search Report and Written Opinion of PCT Application No. PCT/JP2021/033617, issued on Dec. 14, 2021, 08 pages of ISRWO.

(Continued)

*Primary Examiner* — Andargie M Aychillhum
(74) *Attorney, Agent, or Firm* — CHIP LAW GROUP

(57) ABSTRACT

Provided is an electromagnetic wave absorber capable of further expanding applicable objects while reducing a size of a unit structure, and at the same time, improving the degree of freedom in arrangement. An electromagnetic wave absorber 201 includes a substrate 202, a first wiring pattern 203 mounted on one surface of the substrate, and a second wiring pattern 204 mounted on the other surface opposite to the one surface, the first wiring pattern 203 includes a line portion 211 extending in parallel to a direction in which an external electric field is generated, a capacitor portion 212 in which a potential difference is generated by the external electric field, and a first connecting portion 213 and a second connecting portion 214 which connect each of ends of the line portion with the capacitor portion, and the second wiring pattern 204 includes a wire portion 221 which extends in the same direction as the line portion and is arranged at a position opposite to the line portion, and
(Continued)

extension portions 222 and 223 that are branched to be bent from ends of the wire portion.

12 Claims, 5 Drawing Sheets

(58) Field of Classification Search
USPC .......................................................... 174/261
See application file for complete search history.

(56) References Cited

FOREIGN PATENT DOCUMENTS

| JP | 2014-110325 A | 6/2014 |
|----|---------------|--------|
| WO | 2018/189983 A1 | 10/2018 |

OTHER PUBLICATIONS

Andy, et al., "A Perfect Metamaterial Absorber", Physical Review Letters, American Physical Society, vol. 100, No. 20, May 21, 2008, 07 pages.

* cited by examiner

FIG. 2
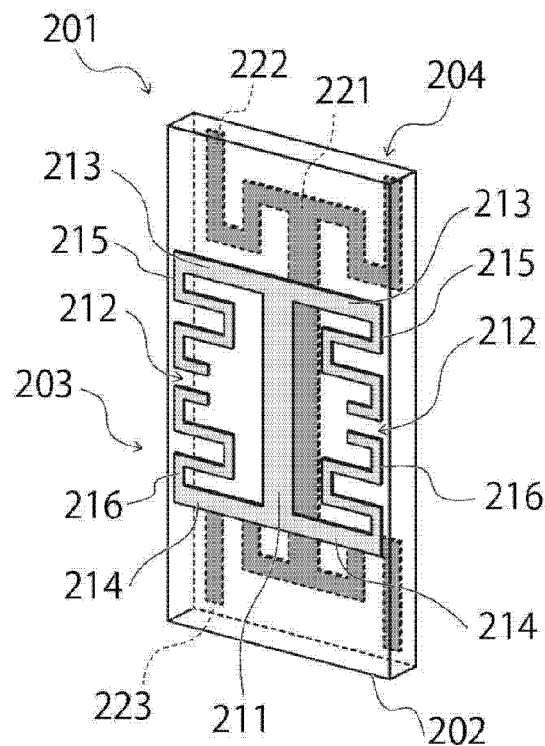
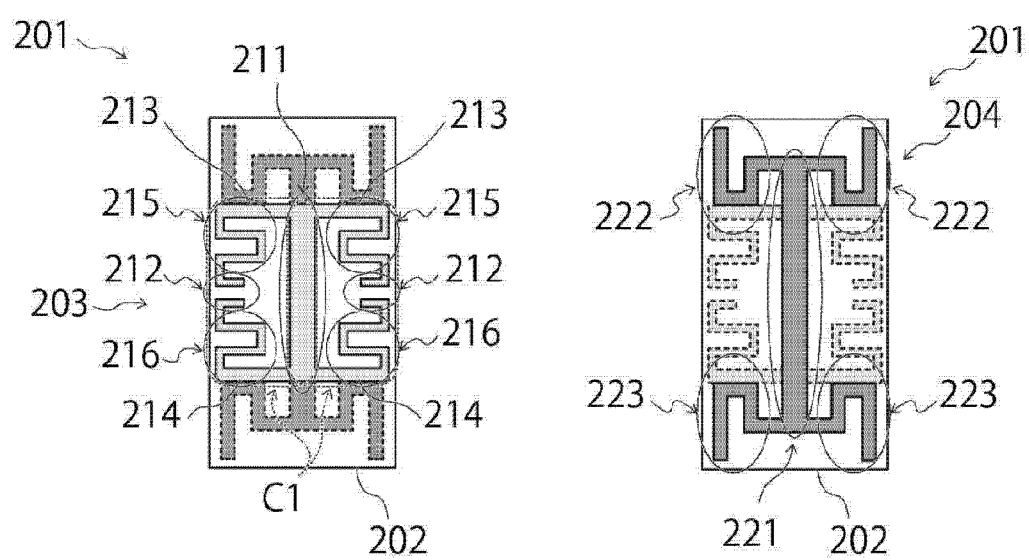
FIG. 3A  FIG. 3B

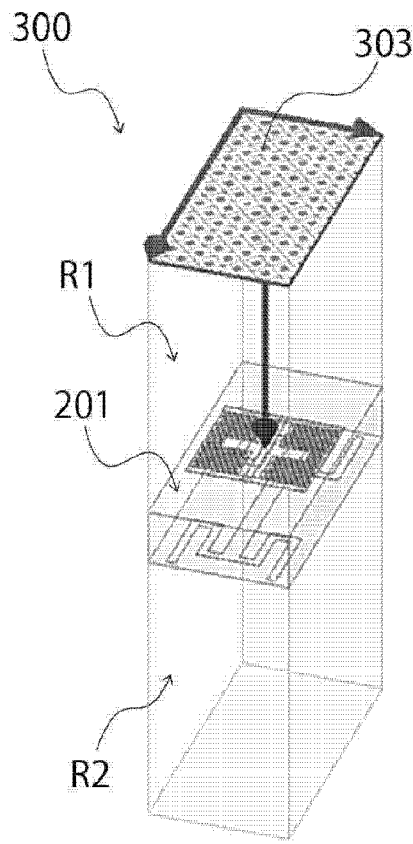
FIG. 6A
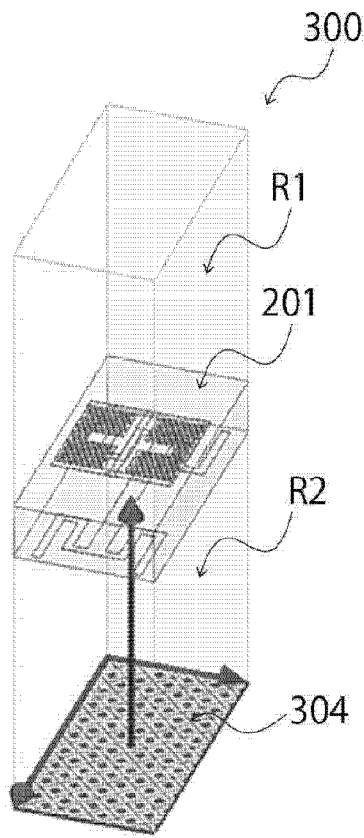
FIG. 6B
FIG. 7
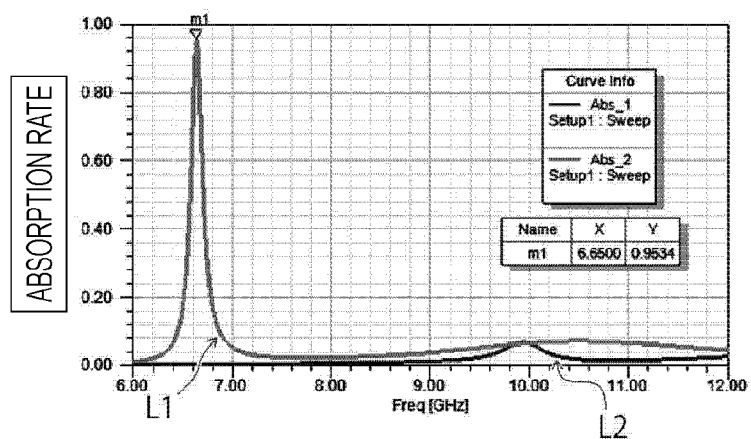

ELECTROMAGNETIC WAVE ABSORBER

CROSS REFERENCE TO RELATED APPLICATIONS

This application is a U.S. National Phase of International Patent Application No. PCT/JP2021/033617 filed on Sep. 14, 2021, which claims priority benefit of Japanese Patent Application No. JP 2020-176081 filed in the Japan Patent Office on Oct. 20, 2020. Each of the above-referenced applications is hereby incorporated herein by reference in its entirety.

TECHNICAL FIELD

The present technology relates to an electromagnetic wave absorber, and more particularly, to an electromagnetic wave absorber that absorbs an electromagnetic wave using wiring patterns arranged on both surfaces of a substrate.

BACKGROUND ART

In recent years, many electronic devices that emit electromagnetic waves, such as wireless communication devices, medical devices, and home appliances, have been used in various fields. There is a possibility that unnecessary electromagnetic waves emitted by an electronic device causes malfunction in the electronic device, surrounding devices, or the like, or impairs the health of a human body. In order to suppress such an influence, electromagnetic wave absorbers and electromagnetic wave shields that absorb or shield unnecessary electromagnetic waves have been proposed.

For example, Patent Document 1 proposes an electromagnetic wave absorber having a metamaterial structure provided with at least a pair of split ring conductors, opposite to each other with a predetermined gap interposed therebetween, the pair of split ring conductors being electrically connected by a via conductor.

Furthermore, Patent Document 2 proposes an electromagnetic wave shielding material for shielding an electromagnetic wave having a specific frequency, the electromagnetic wave shielding material including a substrate and a plurality of resonance loops arranged on the substrate, the plurality of resonance loops being arranged to be magnetically coupled to each other, and each of the resonance loops being configured to form an LC parallel resonance circuit and resonate at the specific frequency.

Moreover, Non-Patent Document 1 proposes an absorber having a metamaterial structure that almost completely absorbs an electromagnetic wave of a specific linearly polarized wave component incident from one surface without using a lossy material such as ferrite. The absorber of Non-Patent Document 1 does not include a solid GND surface, and thus, can transmit frequencies other than a specific absorption frequency.

CITATION LIST

Patent Document

Patent Document 1: Japanese Patent Application Laid-Open No. 2014-110325
Patent Document 2: International Publication No. 2018/189983

Non-Patent Document

Non-Patent Document 1: N. I. Landy, S. Sajuyigbe, J. J. Mock, D. R. Smith, and W. J. Padilla, "A Perfect Metamaterial Absorber", Phys. Rev. Lett. 100, 207402 (2008).

SUMMARY OF THE INVENTION

Problems to be Solved by the Invention

In the technologies of Patent Document 1 and Patent Document 2, however, a solution for expansion of applicable objects with a size reduction of a unit structure is not proposed, and there is a demand for further development of an electromagnetic wave absorber simultaneously satisfying the both.

Furthermore, the technology of Non-Patent Document 1 can be configured inexpensively only with a substrate on which a metal wiring pattern is drawn, but a periodic structure is required, and thus, it is difficult to obtain a sufficient effect without a certain number of cells. Here, a long side of a size of a unit structure body (unit cell) described in Non-Patent Document 1 is as large as about $\lambda/2$, there is a problem that applicable objects are limited when its practical use is considered. For example, assuming that a minimum of 3×3 cells are required to obtain sufficient absorption characteristics, mounting is possible only for an object having a large plane of approximately $1.4\lambda \times 0.5\lambda$ or more.

Therefore, a main object of the present technology is to provide an electromagnetic wave absorber capable of further expanding applicable objects while reducing a size of a unit structure, and at the same time, improving the degree of freedom in arrangement.

Solutions to Problems

An electromagnetic wave absorber according to the present technology includes: a substrate; a first wiring pattern mounted on one surface of the substrate; and a second wiring pattern mounted on the other surface opposite to the one surface, the first wiring pattern includes a line portion extending in parallel to a direction in which an external electric field is generated, a capacitor portion in which a potential difference is generated by the external electric field, and a first connecting portion and a second connecting portion which connect each of ends of the line portion with the capacitor portion, and the second wiring pattern includes a wire portion which extends in the same direction as the line portion and is arranged at a position opposite to the line portion, and an extension portion that is branched to be bent from an end of the wire portion. Here, the extension portion refers to a wiring portion that has a plurality of bent portions, and thus, has a total length longer than that of a line segment connecting both ends of the extension portion at the shortest distance.

Effects of the Invention

According to the present technology, it is possible to provide the electromagnetic wave absorber capable of further expanding applicable objects while reducing the size of the unit structure, and at the same time, improving the degree of freedom in arrangement. Note that the above-described effect is not necessarily limited, and any effect illustrated in the present specification or other effects that can be grasped from the present specification may be exhibited in addition to the above-described effect or instead of the above-described effect.

BRIEF DESCRIPTION OF DRAWINGS

FIG. 2 is a perspective view illustrating a configuration example of an electromagnetic wave absorber according to a first embodiment of the present technology.

FIGS. 3A and 3B are plan views illustrating the configuration example of the electromagnetic wave absorber according to the first embodiment of the present technology.

FIGS. 6A and 6B are schematic views illustrating an example of the electromagnetic wave absorption rate of the electromagnetic wave absorber according to the first embodiment of the present technology.

FIG. 7 is a graph illustrating a relationship between the electromagnetic wave absorption rate and a frequency at which the electromagnetic wave absorber according to the embodiment of the present technology is operated.

MODE FOR CARRYING OUT THE INVENTION

Figure 1:
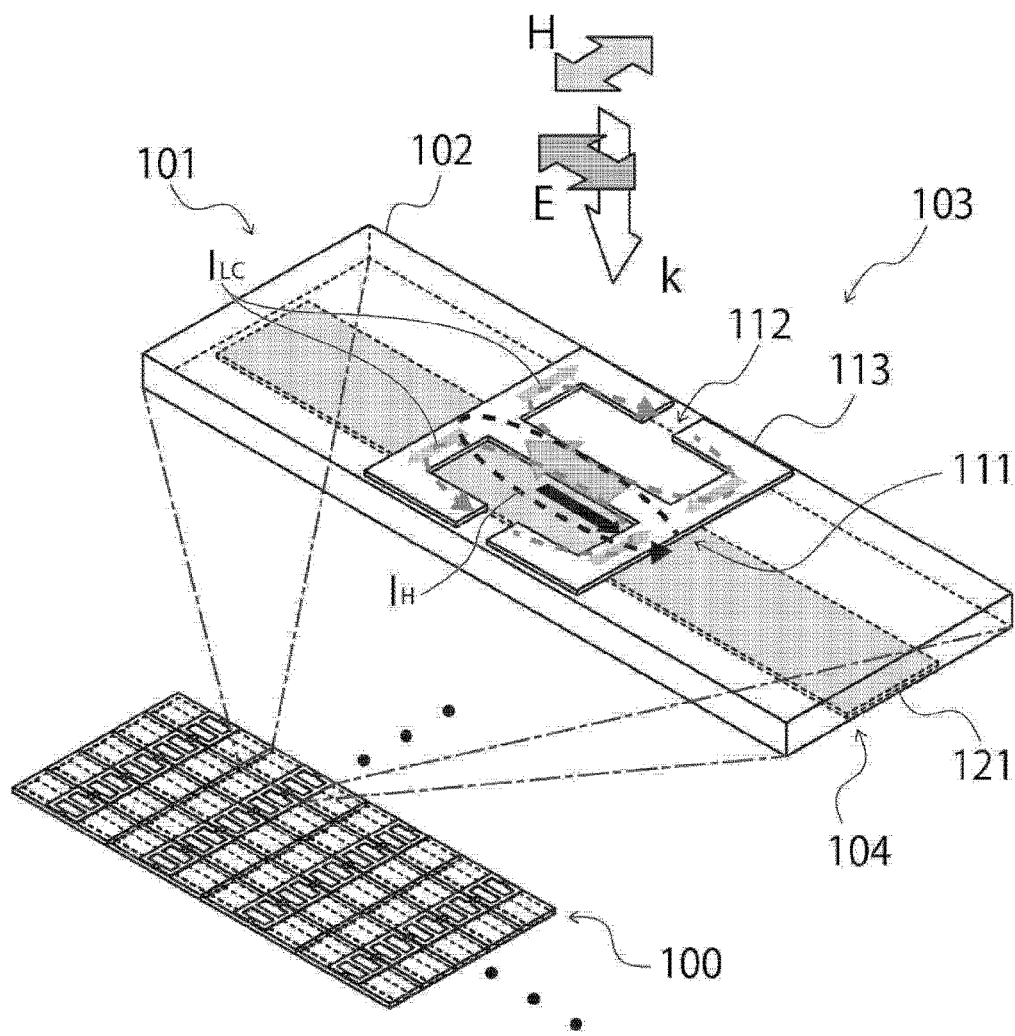
FIGS. 1A and 1B are schematic views illustrating a configuration example of an electromagnetic wave absorber according to the related art.

Hereinafter, preferred embodiments for carrying out the present technology will be described with reference to the drawings. The embodiments to be described hereinafter illustrate examples of representative embodiments of the present technology, and can be combined with any embodiment. Furthermore, the scope of the present technology is not narrowly construed by these. Note that a description will be given in the following order.
1. First Embodiment
  (1) Configuration Example of Conventional Electromagnetic Wave Absorber
  (2) Configuration Example of Electromagnetic Wave Absorber 201
  (3) Operation Example of Electromagnetic Wave Absorber 201
  (4) Configuration Example of Electromagnetic Wave Absorbing Unit 200
  (5) Example (Simulation)
2. Second Embodiment
3. Other Applicable Uses 1. First Embodiment (1) Configuration Example of Conventional Electromagnetic Wave Absorber First, a configuration example of a conventional electromagnetic wave absorber will be described with reference to FIGS. 1A and 1B. FIGS. 1A and 1B are schematic views illustrating a configuration example of an electromagnetic wave absorber according to the related art. FIG. 1A is a perspective view illustrating a configuration example of an electromagnetic wave absorbing unit (electromagnetic wave absorbing sheet) according to the related art. FIG. 1B is an enlarged perspective view illustrating a configuration example of the electromagnetic wave absorber which is a unit structure body (unit cell) of the electromagnetic wave absorbing unit illustrated in FIG. 1A.

As illustrated in FIG. 1A, an electromagnetic wave absorbing unit 100 according to the related art has, for example, a metamaterial structure in which unit structure bodies each having a size sufficiently smaller than a wavelength of an electromagnetic wave and having a resonator therein are arrayed in a dielectric. Note that, as an example, an interval between the unit structure bodies (resonators) of the metamaterial is set to about 1/10 or less, or about 1/5 or less of the wavelength of the electromagnetic wave to be used.

With such a configuration, a dielectric constant $\varepsilon$ and/or a magnetic permeability $\mu$ of the metamaterial can be artificially controlled, and a refractive index n $(=\pm[\varepsilon\cdot\mu]^{1/2})$ of the metamaterial can be artificially controlled. In particular, in the metamaterial, the refractive index can be set to a negative value with respect to an electromagnetic wave having a desired wavelength by appropriately adjusting, for example, a shape, a dimension, and the like of the unit structure body to simultaneously achieve a negative dielectric constant and a negative magnetic permeability.

Meanwhile, a resonance (operation) frequency $\omega$ of the metamaterial is determined by an inductance L and a capacitance C in a case where the metamaterial is described as a circuit according to the LC circuit theory, and the resonance frequency becomes lower as the inductance L and the capacitance C increase. That is, if a high-density structure with the large inductance L and the large capacitance C is provided, even metamaterial having a small size can function for a wave having a long wavelength (=a low frequency).

As illustrated in FIG. 1B, an electromagnetic wave absorber 101, which is the unit structure body of the electromagnetic wave absorbing unit 100, is formed in a similar configuration as a unit cell described in Non-Patent Document 1, for example. The electromagnetic wave absorber 101 includes: a substrate 102 having a rectangular planar shape; a first wiring pattern 103 mounted on an upper surface of the substrate 102 on which an electromagnetic wave is incident; and a second wiring pattern 104 mounted on a lower surface opposite to the upper surface of the substrate 102. The first wiring pattern 103 and the second wiring pattern 104 are formed using metal wirings as an example.

The first wiring pattern 103 includes: a line portion 111 extending in parallel to a direction in which an external electric field is generated; a pair of capacitor portions 112 in which a potential difference is generated by the external electric field; and a connecting portion 113 that connects both ends of the line portion 111 with each of the capacitor portions 112.

The line portion 111 is arranged at a center position of the substrate 102 in a width direction so as to extend in a direction parallel to an extending direction of the substrate 102. The pair of capacitor portions 112 is arranged symmetrically on both sides of the substrate 102 in the width direction from the line portion 111. The line portion 111, the capacitor portion 112, and the connecting portion 113 constitute one closed circuit on each of both sides of the line portion 111.

The second wiring pattern 104 has a wire portion 121 which extends in the same direction as the line portion 111 of the first wiring pattern 103 and is arranged at a position opposite to line portion 111. The wire portion 121 is arranged at a center position of the substrate 102 in the width direction so as to extend in the direction parallel to the extending direction of the substrate 102, which is similar to the line portion 111.

As illustrated in FIG. 1B, a case is considered in which an external electric field E exists in a direction parallel to the line portion 111 above the outside of the electromagnetic wave absorber 101, an external magnetic field H orthogonal to the external electric field E exists in a width direction of the line portion 111, and an electromagnetic wave k is incident on an upper surface of the electromagnetic wave absorber 101.

In a case where the electromagnetic wave k is incident on the upper surface of the electromagnetic wave absorber 101, first, a current flowing in the extending direction (arrow direction in FIG. 1B) of the line portion 111 of the first wiring pattern 103 is induced by the external electric field E. Next, an LC resonant current $I_{LC}$ induced by the external electric field E flows through each of the closed circuits formed on the both sides of the line portion 111. Then, ring currents $I_H$ that generate magnetic fields coupled with the external magnetic field H flow through the line portion 111 and the wire portion 121 in directions opposite to each other. Therefore, the electromagnetic wave absorber 101 can absorb the electromagnetic wave k incident on the upper surface and suppress an electromagnetic wave to be transmitted.

Here, as an example, the electromagnetic wave absorber 101 having a structure similar to that of the unit cell described in Non-Patent Document 1 has a unit cell size of long side 12.0 mm×short side 4.2 mm×thickness 0.65 mm. When a wavelength λ of the electromagnetic wave k is used, the unit cell size can be expressed as long side 0.466λ×short side 0.163λ×thickness 0.0252λ. Therefore, a unit cell size of about λ/2 is required in a long side direction, which corresponds to a size of about 60 mm in the 2.4 GHz band, about 30 mm in the 5 GHz band, and about 5 mm in the 28 GHz band.

Since the metamaterial requires a periodic structure, it is difficult to obtain a sufficient effect of an electromagnetic wave absorption characteristic without a certain number of unit cells. Then, for example, assuming that of 3×3 cells or more of the electromagnetic wave absorbers 101 are required in order to form the electromagnetic wave absorbing unit 100 having the metamaterial structure using the electromagnetic wave absorbers 101, the electromagnetic wave absorbers 101 can be applied only to an object having a large mounting surface of 1.4λ×0.5λ or more.

Therefore, an example of a configuration of an electromagnetic wave absorber capable of further expanding applicable objects while reducing a size of the electromagnetic wave absorber, which is a unit structure body of the metamaterial, and at the same time, improving the degree of freedom in arrangement will be described in the present embodiment.

(2) Configuration Example of Electromagnetic Wave Absorber 201

A configuration example of an electromagnetic wave absorber 201 according to a first embodiment of the present technology will be described with reference to FIGS. 2, 3A, and 3B. FIG. 2 is a perspective view illustrating a configuration example of the electromagnetic wave absorber 201 according to the present embodiment. FIG. 3A is a plan view illustrating one surface of a substrate on which a first wiring pattern of the electromagnetic wave absorber 201 is mounted. FIG. 3B is a plan view illustrating the other surface of the substrate on which a second wiring pattern of the electromagnetic wave absorber 201 is mounted. The electromagnetic wave absorber 201 is a unit structure body of a metamaterial, and can control a pulse of an electromagnetic wave, a sound wave, or the like.

As illustrated in FIG. 2, the electromagnetic wave absorber 201 includes, as an example, a substrate 202 having a rectangular planar shape, a first wiring pattern 203 mounted on an upper surface which is one surface of the substrate 102 on which an electromagnetic wave is incident, and a second wiring pattern 204 mounted on a lower surface which is the other surface opposite to the one surface of the substrate 102. The first wiring pattern 203 and/or the second wiring pattern 204 are formed in a metamaterial structure, as an example.

As an example, the substrate 202 is a multilayer substrate having the upper surface and the lower surface, and can be manufactured by a general manufacturing method such as bonding dielectric substrates to each other with an adhesive. An aspect ratio (long side/short side) of the substrate 202 according to the present embodiment is 1.5 or more. Therefore, the electromagnetic wave absorber 201 having a smaller area can be achieved.

Here, in a case where the substrate 202 is such thick that it is difficult to ignore a phase difference of an external electromagnetic field between the surface of the first wiring pattern 203 and the surface of the second wiring pattern 204, coupling with an external magnetic field is weakened, which leads to a decrease in an absorption rate. From this viewpoint, it is preferable not to thicken the substrate 202 above a certain extent. Therefore, as an example, the thickness of the substrate 202 is formed to be thinner than ⅕ of an effective wavelength. Therefore, it is possible to maintain a high absorption rate.

As illustrated in FIGS. 2 and 3A, the first wiring pattern 203 includes: a line portion 211 extending in parallel to a direction in which an external electric field is generated; a pair of capacitor portions 212 in which a potential difference is generated by the external electric field; and a first connecting portion 213 and a second connecting portion 214 that connect both ends of the line portion 211 with each of the capacitor portions 212.

A first meandering portion 215 meandering to extend a wiring length is formed between the capacitor portion 212 and the first connecting portion 213. Similarly, a second meandering portion 216 meandering to extend a wiring length is formed between the capacitor portion 212 and the second connecting portion 214. Here, the meandering portion refers to a wiring portion that has a plurality of zigzag bent portions, and thus, has a total length longer than that of a line segment connecting both ends of the meandering portion at the shortest distance. Note that shapes of the first meandering portion 215 and the second meandering portion 216 are not limited to shapes of the present embodiment, and may be any shape that extends a wiring length.

The line portion 211 is arranged at a center position of the substrate 202 in a width direction so as to extend in a direction parallel to an extending direction of the substrate 202. The pair of capacitor portions 212 is arranged symmetrically on both sides of the substrate 202 in the width direction from the line portion 211. The line portion 211, the capacitor portion 212, the first connecting portion 213, the first meandering portion 215, the second connecting portion 214, and the second meandering portion 216 constitute one closed circuit C1 on each of both sides of the line portion 211. It is preferable to set a high density such that a total wiring length of the first meandering portion 215 and the second meandering portion 216 in the closed circuit C1 is twice or more a length of the line portion 211 in the extending direction. Furthermore, a width of the line portion 211 is preferably wider than widths of the other wiring parts of the first wiring pattern 203.

As illustrated in FIGS. 2 and 3B, the second wiring pattern 204 includes a wire portion 221 that extends in the same direction as the line portion 211 of the first wiring pattern 203 and is arranged at a position opposite to the line portion 211.

The wire portion 221 is arranged at a center position of the substrate 202 in the width direction so as to extend in the direction parallel to the extending direction of the substrate 202, which is similar to the line portion 211. The second wiring pattern 204 includes a first extension portion 222 and a second extension portion 223 which are branched to be bent symmetrically from both ends of the wire portion 221 in the width direction. The first extension portion 222 and the second extension portion 223 are arranged at effective positions on a lower surface of the electromagnetic wave absorber 201.

The wire portion 221, the first extension portion 222, and the second extension portion 223 constitute one open circuit on each of both sides of the wire portion 221. Furthermore, a width of the wire portion 221 is preferably wider than widths of the other wiring parts of the second wiring pattern 204. Note that shapes of the first extension portion 222 and the second extension portion 223 are not limited to shapes of the present embodiment, and may be any shape that extends a wiring length.

Each distal end of the first extension portion 222 extends toward one end of the substrate 202 in the extending direction. Each distal end of the second extension portion 223 extends toward the other end of the substrate 202 in the extending direction. The first extension portion 222 and the second extension portion 223 are formed in a high-density structure, and are arranged at positions not to overlap with the capacitor portion 212, the first connecting portion 213, and the second connecting portion 214. Here, the high density means that the total wiring length of the extension portions is equal to or longer than the length of the wire portion, for example, twice or more. Therefore, unnecessary resonance between the upper and lower surfaces of the substrate 202 is prevented, and electromagnetic coupling that is difficult to control is reduced, and thus, a desired characteristic is easily achieved.

As described above, the first wiring pattern 203 is formed to be symmetric with respect to a central axis in the width direction and/or a central axis in the extending direction of line portion 211. Furthermore, the second wiring pattern 204 is formed to be symmetric with respect to a central axis in the width direction and/or a central axis in the extending direction of the wire portion 221. Note that a thickness of the second wiring pattern 204 is preferably larger than a thickness of the first wiring pattern 203. As the thickness increases, a resistance of such a part decreases, and thus, a current can easily flow by the second wiring pattern 204. Therefore, the electromagnetic wave absorber 201 is easily coupled to the external magnetic field since the current easily flows through the wire portion 221, and as a result, the absorption rate can be increased.

(3) Operation Example of Electromagnetic Wave Absorber 201

Next, an operation example of the electromagnetic wave absorber 201 according to the present embodiment will be described with reference to FIGS. 2, 3A, and 3B. Similarly to FIG. 1B, a case is considered in which an external electric field E exists in a direction parallel to the line portion 211 above the outside of an upper surface of the electromagnetic wave absorber 201, an external magnetic field H orthogonal to the external electric field E exists in a width direction of the line portion 211, and an electromagnetic wave k is incident on an upper surface of the electromagnetic wave absorber 201.

In a case where the electromagnetic wave k is incident on the upper surface of the electromagnetic wave absorber 201, first, a current flowing in the extending direction of the line portion 211 of the first wiring pattern 203 is induced by the external electric field E. Next, an LC resonant current $I_LC$ induced by the external electric field E flows through each of the closed circuits C1 formed on the both sides of the line portion 211.

In this manner, each of the closed circuits C1 operates as an LC resonance circuit by making the potential difference in each of the capacitor portions 212 by the electromagnetic wave k incident on the upper surface of the electromagnetic wave absorber 201. When a capacitance of each of the capacitor portions 212 is C, and a total inductance of the respective closed circuits C1 is L, a resonance frequency f at this time is expressed by the following Formula (1).

$$f=1/\{2\pi \cdot (LC)^{1/2}\} \tag{1}$$

The electromagnetic wave absorber 201 can increase the inductance L of the closed circuit C1 by forming the first meandering portion 215 and the second meandering portion 216 in each of the closed circuits C1 of the first wiring pattern 203, and thus, a lower resonance frequency f can be achieved as compared with the related art. Therefore, when compared at the same resonance frequency f, the electromagnetic wave absorber 201 can be formed to be smaller than that in the related art.

Moreover, ring currents $I_H$ that generate magnetic fields coupled with the external magnetic field H flow through the line portion 211 and the wire portion 221 of the second wiring pattern 204 in directions opposite to each other in the extending direction. In this manner, in the electromagnetic wave absorber 201, the current flows through the wire portion 221 in the opposite direction to the line portion 211, and the magnetic field in a direction parallel to a width direction of the electromagnetic wave absorber 201 formed by the ring current $I_H$ is coupled with the external magnetic field H, thereby generating an effect of absorbing the incident electromagnetic wave k.

At this time, in order to facilitate the coupling with the external magnetic field H, an electrical length of the open circuit including the wire portion 221 needs to be sufficiently long. Since the electromagnetic wave absorber 201 has the first extension portion 222 and the second extension portion 223 branched to be bent from both the ends of the wire portion 221 on both the sides in the width direction, the coupling with the external magnetic field H can be facilitated similarly to or more than the related art even if the size of the electromagnetic wave absorber 201 in the extending direction is reduced.

Therefore, the electromagnetic wave absorber 201 can be formed to have a size smaller than λ/2 in the extending direction, the size being about λ/2 in the related art, for example. That is, in a case of being manufactured to have the same size as that of the related art, the electromagnetic wave absorber 201 can be operated at a lower frequency than that of the related art.

With the electromagnetic wave absorber 201 according to the present embodiment, each of two wiring surfaces is formed in the high-density structure having the meandering portion and the extension portion, the unit cell size can be greatly reduced as compared with the related art while maintaining electromagnetic wave absorption performance. Therefore, according to the electromagnetic wave absorber 201, applicable objects can be expanded as compared with the related art while reducing the size of the unit structure, and at the same time, the degree of freedom in arrangement can be improved. Note that the electromagnetic wave absorber 201 can reflect an electromagnetic wave as well as absorb an electromagnetic wave.

(4) Configuration Example of Electromagnetic Wave Absorbing Unit 200

Figures 4A, 4B:
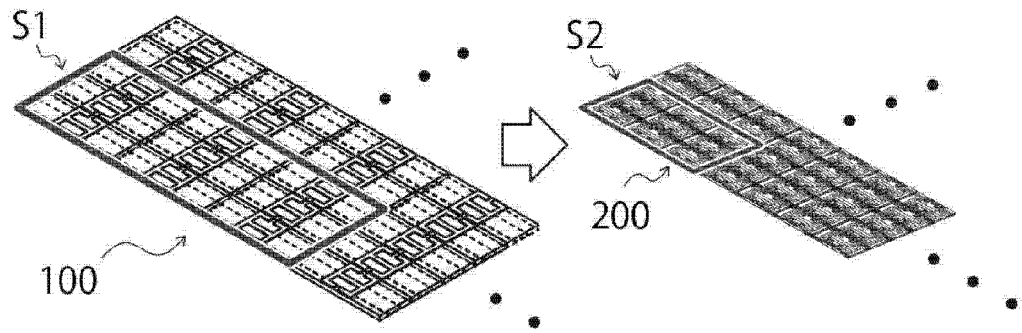
FIGS. 4A and 4B are schematic views illustrating a configuration example of an electromagnetic wave absorbing unit according to the first embodiment of the present technology.

Next, a configuration example of an electromagnetic wave absorbing unit (electromagnetic wave absorbing sheet) 200 according to the present embodiment will be described with reference to FIGS. 4A and 4B. FIG. 4A is a schematic view illustrating a configuration example of the electromagnetic wave absorbing unit 100 according to the related art. FIG. 4B is a schematic view illustrating a configuration example of the electromagnetic wave absorbing unit 200 according to the present embodiment.

As illustrated in FIG. 4A, the electromagnetic wave absorbing unit 100 according to the related art is formed, for example, in a periodic structure in which the electromagnetic wave absorbers 101 are periodically arrayed. Furthermore, a cell region S1 indicates a region having a size of 3×3 cells of the electromagnetic wave absorbers 101 in the electromagnetic wave absorbing unit 100. An area of the electromagnetic wave absorber 101 having a size similar to that of the unit cell described in Non-Patent Document 1 is long side 0.466λ×short side 0.163λ (with thickness 0.0252λ) as described above.

As illustrated in FIG. 4B, the electromagnetic wave absorbing unit 200 according to the present embodiment is formed, for example, in a periodic structure in which the electromagnetic wave absorbers 201 are periodically arrayed. Furthermore, a cell region S2 indicates a region having a size of 3×3 cells of the electromagnetic wave absorbers 201 in the electromagnetic wave absorbing unit 200. An area of the electromagnetic wave absorber 101 having an effect similar to that of the electromagnetic wave absorber 101 according to the related art can be set to long side 0.177λ×short side 0.0887λ (with thickness 0.0355λ) by having the above-described configuration.

In this manner, the electromagnetic wave absorbing unit 200 has an area ratio of about 21% (volume ratio of about 29%) as compared with the electromagnetic wave absorbing unit 100 according to the related art, and can be greatly reduced in size. Therefore, the electromagnetic wave absorbing unit 200 can further expand applicable objects, and at the same time, can improve the degree of freedom in arrangement.

(5) Example (Simulation)

Figures 5A, 5B:
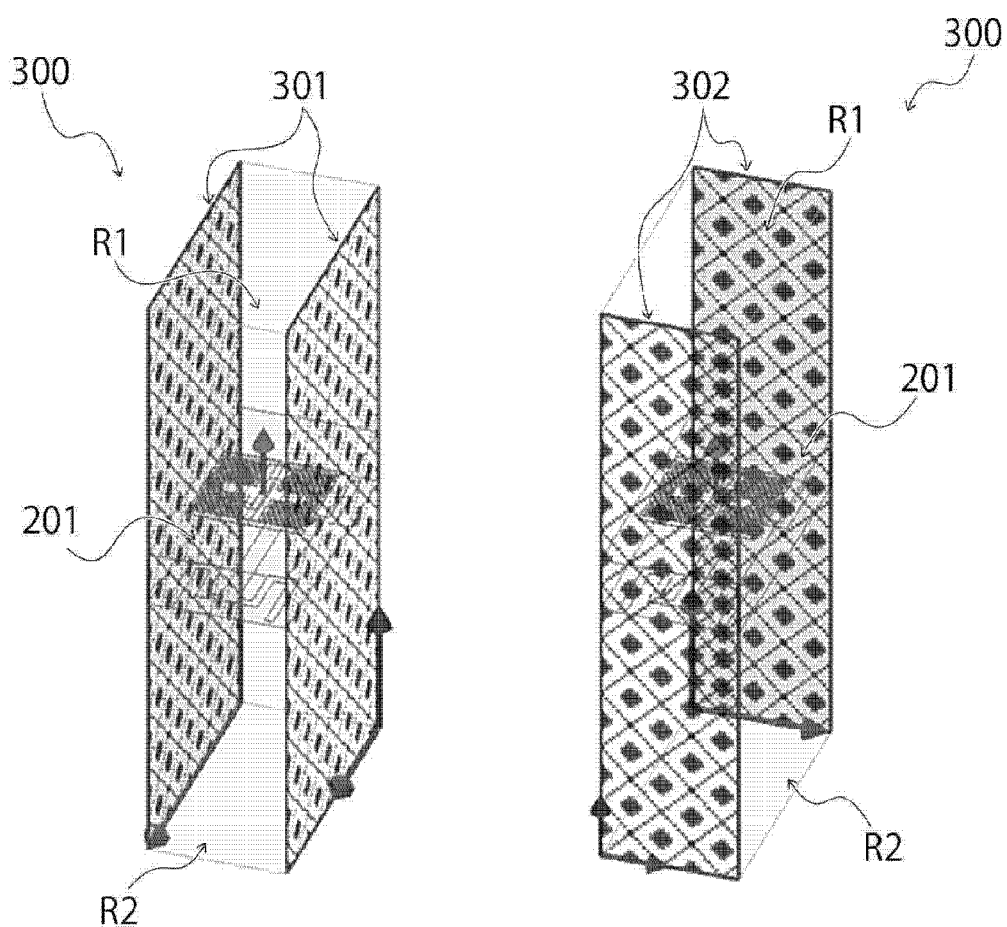
FIGS. 5A and 5B are schematic views illustrating an example of an electromagnetic wave absorption rate of the electromagnetic wave absorber according to the first embodiment of the present technology.

Next, an example (simulation) of an electromagnetic wave absorption rate of an electromagnetic wave absorbing unit 300 using the electromagnetic wave absorber 201 according to the present embodiment will be described. FIG. 5A is a schematic view illustrating a structure in which periodic boundary conditions are set on both side surfaces of the electromagnetic wave absorber 201 in the width direction. FIG. 5B is a schematic view illustrating a structure in which periodic boundary conditions are set on both end surfaces of the electromagnetic wave absorber 201 in the extending direction.

First, a technique of the present example (simulation) will be described. Three-dimensional electromagnetic field analysis by a finite element method (FEM) is used as an analysis technique of the present embodiment. Furthermore, a high frequency structure simulator (HFSS) is used as software of the present example.

The electromagnetic wave absorbing unit 300 having the electromagnetic wave absorber 201 as a unit structure body is used for modeling of the present example. The electromagnetic wave absorber 201 of the present example has a size of long side 8 mm×short side 4 mm×thickness 1.6 mm, and a dielectric constant εr=3.66. In the present example, the electromagnetic wave absorber 201 is operated at a frequency of 6.65 GHz. Note that an aspect ratio (long side/short side) of the substrate 202 according to the present example is set to 2. Here, in the present example, effective wavelength=wavelength λ/(3.66)$^{1/2}$≈23.6 mm. Therefore, an effective wavelength ratio of the thickness is approximately 1/15, and an effective wavelength ratio of the short side is approximately 1/6.

As illustrated in FIG. 5A, the electromagnetic wave absorbing unit 300 includes the electromagnetic wave absorber 201 and periodic boundary condition surfaces 301 set on both the side surfaces of the electromagnetic wave absorber 201 in the width direction. Here, the periodic boundary condition is a condition that electromagnetic fields of opposite surfaces are the same, and this enables a simulation of an infinite periodic structure. Furthermore, as illustrated in FIG. 5B, the electromagnetic wave absorbing unit 300 may include periodic boundary condition surfaces 302 set on both the end surfaces of the electromagnetic wave absorber 201 in the extending direction.

Moreover, air regions (or vacuum regions) R1 and R2 are formed above and below the electromagnetic wave absorber 201 of the electromagnetic wave absorbing unit 300. Each of the air regions R1 and R2 only needs to be formed at a height of λ/4 or more in the vertical direction.

Next, with reference to FIGS. 6A and 6B, setting of a surface called a port as an inlet or an outlet of power to a system of the electromagnetic wave absorbing unit 300 will be described. FIG. 6A is a schematic view illustrating a structure in which a power port is set above the electromagnetic wave absorber 201. FIG. 6B is a schematic view illustrating a structure in which a power port is set below the electromagnetic wave absorber 201. In the present example, a technique called "Floquet Port" used in combination with the periodic boundary conditions 301 and 302 illustrated in FIGS. 5A and 5B are used for the electromagnetic wave absorbing unit 300 having the periodic structure such as a metamaterial.

As illustrated in FIG. 6A, the electromagnetic wave absorbing unit 300 includes a power port surface 303 above the electromagnetic wave absorber 201. Furthermore, as illustrated in FIG. 6B, the electromagnetic wave absorbing unit 300 includes a power port surface 304 below the electromagnetic wave absorber 201. The power port surfaces 303 and 304 are the inlet and outlet of power to the system of the electromagnetic wave absorbing unit 300.

Since a value obtained from an analysis result according to the present example is an S parameter that is electrical power balance between the power port surface 303 and the power port surface 304, characteristics including air characteristics of the upper surface and the lower surface of the substrate 202 of the electromagnetic wave absorber 201 appear. However, a value to be desirably obtained is a characteristic of only the substrate 202.

Therefore, a transfer coefficient of air is subtracted from the value obtained from the analysis result to extract the characteristic of only the substrate 202. From the S parameter of only the substrate 202 thus obtained, an absorption rate (Abs) of an electromagnetic wave with respect to an incident wave from the power port surface 303 is calculated by the following Formula (2).

Here, in Formula (2), a transfer coefficient of the upper surface of the substrate 202 is set to S11, and a transfer coefficient of the lower surface is set to S21.

$$Abs = 1 - |S_{11}|^2 - |S_{21}|^2 \qquad (2)$$

Next, an electromagnetic wave absorption rate of the electromagnetic wave absorber 201 in the electromagnetic wave absorbing unit 300 according to the present example will be described with reference to FIG. 7. FIG. 7 is a graph illustrating a relationship between a frequency at which the electromagnetic wave absorber 201 is operated and an electromagnetic wave absorption rate. The horizontal axis in FIG. 7 indicates the frequency at which the electromagnetic wave absorber 201 is operated. The vertical axis in FIG. 7 indicates the electromagnetic wave absorption rate of the electromagnetic wave absorber 201.

A curve L1 and a curve L2 illustrated in FIG. 7 represent absorption rates with respect to the incident wave from the power port surface 303 due to a difference in "polarized wave" of the electromagnetic wave absorbed by the electromagnetic wave absorber 201. Similarly to the electromagnetic wave illustrated in FIG. 1A, the curve L1 represents the absorption rate for a polarized wave in which a long side direction of the electromagnetic wave absorber 201 coincides with a vector of the electric field E. A curve L2 represents an absorption rate for a polarized wave in which directions of vectors of the electric field E and the magnetic field H are reversed from those of the electromagnetic wave illustrated in FIG. 1A.

As illustrated in FIG. 7, in the case of the curve L1, the frequency has a peak in the vicinity of 6.65 GHz, and the electromagnetic wave absorption rate is 95% or more (0.9534). On the other hand, in the case of the curve L2, the frequency has a peak in the vicinity of 9.95 GHz, and the electromagnetic wave absorption rate is 8% or less (less than 0.08).

According to the present example, it has been found that the electromagnetic wave absorbing unit 300 formed in the periodic structure of the electromagnetic wave absorbers 201 can absorb the polarized wave of the electromagnetic wave in which the vector of the electric field E coincides with the long side direction of the electromagnetic wave absorber 201 with extremely high accuracy.

2. Second Embodiment

Figure 8A:
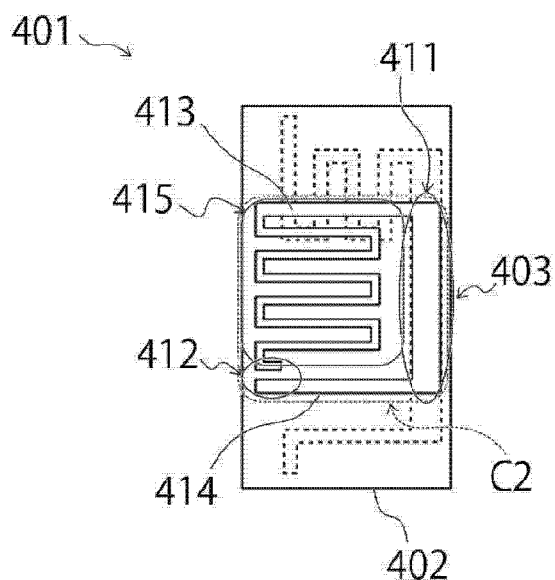
FIGS. 8A and 8B is a are perspective views illustrating a configuration example of an electromagnetic wave absorber according to a second embodiment of the present technology.
Figure 8B:
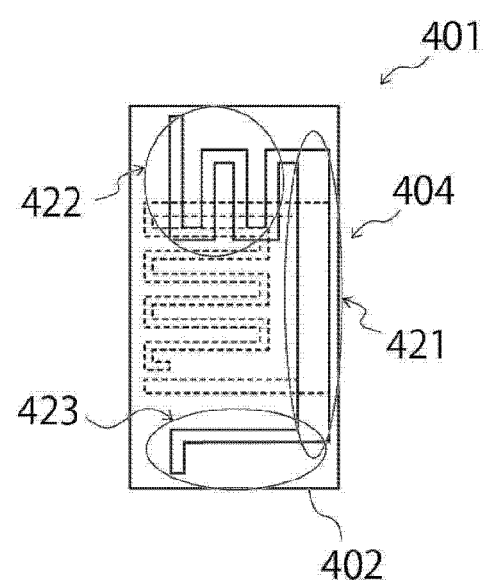

Next, a configuration example of an electromagnetic wave absorber 401 according to a second embodiment of the present technology will be described with reference to FIGS. 8A and 8B. FIG. 8A is a plan view illustrating one surface of a substrate on which a first wiring pattern of the electromagnetic wave absorber 401 is mounted. FIG. 8B is a plan view illustrating the other surface of the substrate on which a second wiring pattern of the electromagnetic wave absorber 401 is mounted.

The electromagnetic wave absorber 401 is different from the electromagnetic wave absorber 201 according to the first embodiment in that the first wiring pattern and the second wiring pattern are asymmetrically formed on the respective surfaces. The other configurations of the electromagnetic wave absorber 401 are similar to the configurations of the electromagnetic wave absorber 201.

As illustrated in FIGS. 8A and 8B, the electromagnetic wave absorber 401 includes, as an example, a substrate 402 having a rectangular planar shape, a first wiring pattern 403 mounted on an upper surface which is one surface of the substrate 402 on which an electromagnetic wave is incident, and a second wiring pattern 404 mounted on a lower surface which is the other surface opposite to the one surface of the substrate 402. The first wiring pattern 403 and/or the second wiring pattern 404 are formed in a metamaterial structure, as an example.

As illustrated in FIG. 8A, the first wiring pattern 403 includes: a line portion 411 extending in parallel to a direction in which an external electric field is generated; a capacitor portion 412 in which a potential difference is generated by the external electric field; and a first connecting portion 413 and a second connecting portion 414 that connect both ends of the line portion 411 with the capacitor portion 412. A meandering portion 415 meandering to extend a wiring length is formed between the capacitor portion 412 and the first connecting portion 413.

As an example, the line portion 411 is arranged to extend in a direction parallel to an extending direction of the substrate 402 on the right side in a width direction of the substrate 402 with respect to the paper surface of FIG. 8A. The capacitor portion 412 is arranged on the left side in the width direction of the substrate 402 with respect to the paper surface of FIG. 8A.

In the first wiring pattern 403, the line portion 411, capacitor portion 412, the first connecting portion 413, the second connecting portion 414, and the meandering portion 415 constitute one closed circuit C2. A total wiring length of the meandering portion 415 in the closed circuit C2 is formed to be twice or more a length of the line portion 411 in an extending direction. Furthermore, a width of the line portion 411 is formed to be wider than widths of the other wiring parts of the first wiring pattern 403.

As illustrated in FIG. 8B, the second wiring pattern 404 includes a wire portion 421 that extends in the same direction as the line portion 411 of the first wiring pattern 403 and is arranged at a position opposite to the line portion 411.

The wire portion 421 is arranged to extend in the direction parallel to the extending direction of the substrate 402 on the right side of the substrate 402 in the width direction, which is similar to the line portion 411. The second wiring pattern 404 includes a first extension portion 422 and a second extension portion 423 which are branched to be bent from both ends of the wire portion 421. The first extension portion 422 has a meandering portion having a zigzag shape. Note that the second extension portion 423 may be formed in a shape including a meandering portion.

In the second wiring pattern 404, the wire portion 421, first extension portion 422, and the second extension portion 423 constitute one open circuit. Furthermore, a width of the wire portion 421 is formed to be wider than widths of the other wiring parts of the second wiring pattern 404.

A distal end of the first extension portion 422 extends toward one end of the substrate 402 in the extending direction. A distal end of the second extension portion 423 extends toward the other end of the substrate 402 in the extending direction. It is preferable that the first extension portion 422 and the second extension portion 423 be formed in a high-density structure, and be arranged at positions not to overlap with the capacitor portion 412, the first connecting portion 413, and the second connecting portion 414.

Note that a thickness of the second wiring pattern 404 is formed to be thicker than a thickness of the first wiring pattern 403. As the thickness increases, a resistance of such a part decreases, and thus, a current can easily flow.

With the electromagnetic wave absorber 401 according to the present embodiment, a unit cell size can be greatly reduced as compared with the related art while maintaining electromagnetic wave absorption performance, which is similar to the electromagnetic wave absorber 201 according to the first embodiment. Therefore, according to the electromagnetic wave absorber 401, applicable objects can be expanded as compared with the related art while reducing a size of a unit structure, and at the same time, the degree of freedom in arrangement can be improved.

3. Other Applicable Uses

Next, applicable uses of a metamaterial having the electromagnetic wave absorbers according to the above-described embodiments of the present technology will be described.

Conventionally, it has been proposed to use a metamaterial having characteristics of a negative refractive index and the like for reflection, shielding, absorption, phase modulation, and the like of various waves including radio waves, light waves, and sound waves. Here, the metamaterial refers to an artificial structure body that generates a function that is hardly exhibited with a substance existing in nature. The metamaterial is produced to exhibit an unnatural property, for example, by arraying unit microstructure bodies such as metal, a dielectric, a magnetic body, a semiconductor, and a superconductor at sufficiently short intervals with respect to a wavelength. The metamaterial thus produced can control pulses of electromagnetic waves or the like by controlling a dielectric constant and a magnetic permeability.

Therefore, the metamaterial having the electromagnetic wave absorbers according to the above-described embodiments can be applied to uses including a pulse control device that performs transmission and reception or light reception and emission, a small antenna, a low-height antenna, a frequency selection filter, an artificial magnetic conductor, an electro-band gap member, an anti-noise member, an isolator, a radio wave lens, and a radar member, an optical lens, an optical film, an optical element for terahertz, a radio wave and optical camouflage/non-visualization member, a heat dissipation member, a heat shielding member, a heat storage member, modulation and demodulation of electromagnetic waves, wavelength conversion, a non-linear device, a speaker, and the like in addition to sensors such as an ETC and a radar.

Note that the present technology can have the following configurations.

(1)

An electromagnetic wave absorber including: a substrate; a first wiring pattern mounted on one surface of the substrate; and a second wiring pattern mounted on another surface opposite to the one surface, in which the first wiring pattern includes a line portion extending in parallel to a direction in which an external electric field is generated, a capacitor portion in which a potential difference is generated by the external electric field, and a first connecting portion and a second connecting portion which connect each of ends of the line portion with the capacitor portion, and the second wiring pattern includes a wire portion which extends in the same direction as the line portion and is arranged at a position opposite to the line portion, and an extension portion that is branched to be bent from an end of the wire portion.

(2)

The electromagnetic wave absorber according (1), in which the first connecting portion and/or the second connecting portion includes a meandering portion formed in a zigzag manner.

(3)

The electromagnetic wave absorber according (2), in which a total wiring length of the meandering portion is twice or more a length of the line portion.

(4)

The electromagnetic wave absorber according to any one of (1) to (3), in which the extension portion is formed in a high-density structure.

(5)

The electromagnetic wave absorber according to any one of (1) to (4), in which the extension portion is arranged at a position not to overlap with the capacitor portion, the first connecting portion, and the second connecting portion.

(6)

The electromagnetic wave absorber according to any one of (1) to (5), in which a width of the line portion and/or the wire portion is wider than widths of other wiring parts of each of the wiring patterns.

(7)

The electromagnetic wave absorber according to any one of (1) to (6), in which the first wiring pattern is formed symmetrically with respect to a central axis in a width direction or a central axis in an extending direction of the line portion.

(8)

The electromagnetic wave absorber according to any one of (1) to (7), in which the second wiring pattern is formed symmetrically with respect to a central axis in a width direction or a central axis in an extending direction of the wire portion.

(9)

The electromagnetic wave absorber according to any one of (1) to (8), in which a thickness of the second wiring pattern is thicker than a thickness of the first wiring pattern.

(10)

The electromagnetic wave absorber according to any one of (1) to (9), in which the first wiring pattern and/or the second wiring pattern is formed using a metamaterial.

(11)

The electromagnetic wave absorber according to any one of (1) to (10), in which the substrate has an aspect ratio (long side/short side) of 1.5 or more.

(12)

The electromagnetic wave absorber according to any one of (1) to (11), in which a thickness of the substrate is thinner than $1/5$ of an effective wavelength.

REFERENCE SIGNS LIST

1000, 200, 300 Electromagnetic wave absorbing unit (electromagnetic wave absorbing sheet)
101, 201, 401 Electromagnetic wave absorber
102, 202, 402 Substrate 103, 203, 403 First wiring pattern
104, 204, 404 Second wiring pattern
111, 211, 131, 411 Line portion
112, 212, 412 Capacitor portion
113, 213, 214, 413, 414 Connecting portion
121, 221, 421 Wire portion
215, 216, 415 Meandering portion
222, 223, 422, 423 Extension portion
301, 302 Periodic boundary condition surface
303, 304 Power port surface
$I_H$, $I_{LC}$ Current
C1, C2 Closed circuit
S1, S2 Cell region
R1, R2 Air region
L1, L2 Curve

The invention claimed is:

1. An electromagnetic wave absorber, comprising:
a substrate;
a first wiring pattern mounted on one surface of the substrate; and
a second wiring pattern mounted on another surface opposite to the one surface,
wherein the first wiring pattern includes a line portion extending in parallel to a direction in which an external electric field is generated, a capacitor portion in which a potential difference is generated by the external electric field, and a first connecting portion and a second connecting portion which connect each of ends of the line portion with the capacitor portion, and
the second wiring pattern includes a wire portion which extends in a same direction as the line portion and is arranged at a position opposite to the line portion, and an extension portion that is branched to be bent from an end of the wire portion.

2. The electromagnetic wave absorber according to claim 1, wherein at least one of the first connecting portion or the second connecting portion includes a meandering portion in a zigzag manner.

3. The electromagnetic wave absorber according to claim 2, wherein a total wiring length of the meandering portion is twice or more a length of the line portion.

4. The electromagnetic wave absorber according to claim 1, wherein the extension portion is formed in a high-density structure.

5. The electromagnetic wave absorber according to claim 1, wherein the extension portion is arranged at a position not to overlap with the capacitor portion, the first connecting portion, and the second connecting portion.

6. The electromagnetic wave absorber according to claim 1, wherein a width of at least one of the line portion or the wire portion is wider than widths of other wiring parts of each of the first wiring pattern and the second wiring pattern.

7. The electromagnetic wave absorber according to claim 1, wherein the first wiring pattern is symmetrically with respect to a central axis in a width direction or a central axis in an extending direction of the line portion.

8. The electromagnetic wave absorber according to claim 1, wherein the second wiring pattern is symmetrically with respect to a central axis in a width direction or a central axis in an extending direction of the wire portion.

9. The electromagnetic wave absorber according to claim 1, wherein a thickness of the second wiring pattern is thicker than a thickness of the first wiring pattern.

10. The electromagnetic wave absorber according to claim 1, wherein at least one of the first wiring pattern or the second wiring pattern is formed using a metamaterial.

11. The electromagnetic wave absorber according to claim 1, wherein the substrate has an aspect ratio (long side/short side) of 1.5 or more.

12. The electromagnetic wave absorber according to claim 1, wherein a thickness of the substrate is thinner than $\frac{1}{5}$ of an effective wavelength.

* * * * *